(12) United States Patent
Shinoda et al.

(10) Patent No.: US 7,340,142 B1
(45) Date of Patent: Mar. 4, 2008

(54) INTEGRATED OPTOELECTRONIC DEVICE AND METHOD OF FABRICATING THE SAME

(75) Inventors: Kazunori Shinoda, Musashino (JP); Takashi Shiota, Sagamihara (JP); Tomonobu Tsuchiya, Hachioji (JP); Takeshi Kitatani, Hino (JP); Masahiro Aoki, Kokubunji (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 11/701,467

(22) Filed: Feb. 2, 2007

(30) Foreign Application Priority Data

Aug. 25, 2006 (JP) .............................. 2006-228847

(51) Int. Cl.
*G02F 1/035* (2006.01)
*G02F 1/295* (2006.01)
*G02B 6/26* (2006.01)
*G02B 6/10* (2006.01)
*G02B 6/12* (2006.01)
*H01L 21/00* (2006.01)

(52) U.S. Cl. .............................. 385/129; 385/2; 385/8; 385/9; 385/14; 385/15; 385/130; 385/131; 385/132; 438/29; 438/30; 438/31

(58) Field of Classification Search ............ 385/2, 385/8, 9, 14, 15, 129–132; 438/29–31
See application file for complete search history.

(56) References Cited

U.S. PATENT DOCUMENTS
6,399,404 B2 * 6/2002 Sakata ......................... 438/22
2007/0014508 A1 * 1/2007 Chen et al. ................... 385/14

FOREIGN PATENT DOCUMENTS
JP     2002-324936     4/2001
JP     2005-353910     6/2004

OTHER PUBLICATIONS

Kitatani, T, et al., "Evaluation of the Optical-Coupling Efficiency of InGaAlAs-InGaAsP Butt Joint Using Novel Multiple Butt-Jointed Laser", IEEE Photonics Technology Letters, vol. 17, No. 6, Jun. 2005, pp. 1148-1150.

* cited by examiner

*Primary Examiner*—Frank G. Font
*Assistant Examiner*—Jerry Martin Blevins
(74) *Attorney, Agent, or Firm*—Reed Smith LLP; Stanley P. Fisher, Esq.; Juan Carlos A. Marquez, Esq.

(57) ABSTRACT

An integrated optoelectronic device includes optical waveguide elements containing InGaAlAs as a principal component, formed on an InP substrate and connected in an end-to-end fashion by butt jointing. An InGaAsP layer is formed on the InP substrate to suppress the mass transport of InP during the fabrication of the integrated optoelectronic device. The InGaAsP layer is formed before the InP substrate is heated at a crystal growth temperature on the order of 700° C. to form the InGaAlAs optical waveguide element.

14 Claims, 11 Drawing Sheets

INTEGRATED OPTOELECTRONIC DEVICE AND METHOD OF FABRICATING THE SAME

CLAIM OF PRIORITY

The present application claims priority from Japanese application JP 2006-228847 filed on Aug. 25, 2006, the content of which is hereby incorporated by reference into this application.

FIELD OF THE INVENTION

The present invention relates to a method of fabricating an integrated optoelectronic device. More particularly, the present invention relates to an integrated optoelectronic device including waveguide-type optoelectronic elements, such as semiconductor lasers and electroabsorption modulators, and a method of fabricating the same.

BACKGROUND OF THE INVENTION

A butt jointing method is one of methods of integrating a plurality of waveguide-type optoelectronic elements, such as semiconductor lasers and optical modulators, with a single InP substrate. The butt jointing method joints a plurality of optical waveguides arranged on a single substrate with their axes aligned in an end-to-end joining fashion. The butt jointing method repeats a processing cycle including the steps of forming a first optical waveguide on a semiconductor substrate by crystal growth, partly coating the first optical waveguide with a mask pattern, removing an uncoated part of the first optical waveguide by an etching process, and connects a second optical waveguide to the first optical waveguide by growing the second optical waveguide by metal organic vapor-phase epitaxy (MOVPE) in a space from which the uncoated part of the first optical waveguide has been removed by necessary times. Using this butt jointing method makes it possible to optimize the material, composition, the number of layers and film thickness of each multilayer optical waveguide structure. Therefore, as compared with a selective growth method that builds a plurality of waveguide-type optoelectronic elements simultaneously by a single cycle of a selective growth process, the butt jointing method is a suitable method of fabricating a high-performance integrated optoelectronic device. The optoelectronic waveguide is a multilayer optoelectronic waveguide structure built by sandwiching a core layer between cladding layers having a refractive index smaller than that of the core layer. In a waveguide-type optoelectronic device having a core layer made of an InGaAlAs material or an InGaAsP material, an InP substrate can serve as the cladding layer contiguous with the substrate.

The characteristic of a known multiple butt-joint type laser built by combining a plurality of InGaAlAs multiple quantum well type laser waveguide layers and a plurality of InGaAsP bulk waveguide layers and the results of examination of the optical coupling efficiency of the butt-jointed joints of the multiple butt-joint type laser are mentioned in IEEE Photonics Technology letters, Vol. 17, p. 1148 (Non-patent document 1). A known integrated optoelectronic device having a third optical waveguide formed in a space formed by removing a defective layer having many crystalline defects and formed between the first waveguide-type optoelectronic element and the second waveguide-type optoelectronic element is disclosed in JP-A No. 324936/2002 (Patent document 1).

SUMMARY OF THE INVENTION

When a first optical waveguide including an InGaAlAs layer grown at a high growth temperature of about 700° C. (hereinafter, referred to as "InGaAlAs waveguide") as a principal component is joined to a second optical waveguide by the known butt jointing method, an InP layer is formed at the joint of the optical waveguides.

The cause of formation of the InP layer in the joint of the InGaAlAs waveguides joined by the butt jointing method will be described with reference to FIG. 1.

Figure 1A:
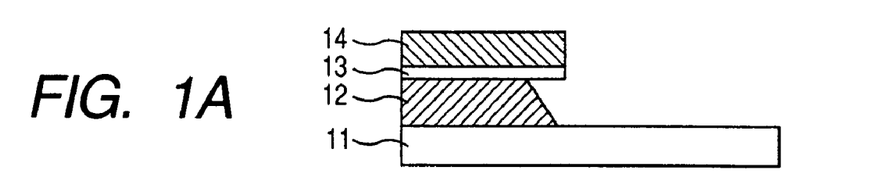
FIG. 1A is a typical sectional view of assistance in explaining problems to be solved by the present invention.
Figure 1B:
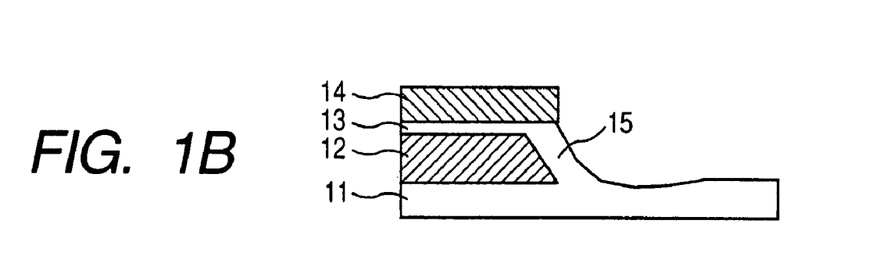
FIG. 1B is a typical sectional view of assistance in explaining problems to be solved by the present invention.
Figure 1C:
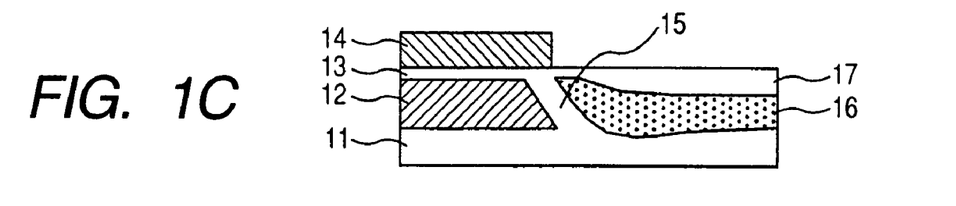
FIG. 1C is a typical sectional view of assistance in explaining problems to be solved by the present invention.

FIG. 1A is a typical sectional view of a structure formed by forming an InGaAlAs waveguide layer 12 on an InP substrate 11, forming an InP cladding layer 13 on the InGaAlAs waveguide layer 12, partly coating the InP cladding layer with a dielectric mask 14 and removing uncoated parts of the InGaAlAs waveguide layer 12 and the InP cladding layer 13 by selective etching. When InGaAlAs waveguides are joined together, an unnecessary part not coated with the dielectric mask 14 of the first InGaAlAs waveguide layer 12 is removed by selective etching as shown in FIG. 1A, the structure is placed and heated at a temperature for growing a second InGaAlAs waveguide layer in a growth chamber. When the structure is thus heated at a high temperature, the InP substrate becomes thermally unstable and InP in the surface of the InP substrate is caused to migrate to the joint by a mass transport effect, and the end of the first InGaAlAs waveguide layer 12 is coated partly or entirely with an InP layer 15 as shown in FIG. 1B. If a second InGaAlAs waveguide 16 and an InP cladding layer 17 are formed by crystal growth on the structure shown in FIG. 1B, the InP layer 15 partly or entirely coating the end of the first InGaAlAs waveguide layer 12 is sandwiched between the first InGaAlAs waveguide layer 12 and the second InGaAlAs waveguide layer 16 as shown in FIG. 1C.

The intensity of the mass transport of InP increases with temperature. Therefore, the formation of the InP layer causes a serious problem when a second InGaAlAs waveguide layer of an InGaAlAs material that grows at a high crystal growth temperature of about 700° C. is joined to a first InGaAlAs waveguide layer by the butt jointing method. The intensity of the mass transport of InP when the second InGaAlAs waveguide layer is joined to the first InGaAlAs waveguide layer is higher than that of the mass transport of InP that occurs when a second waveguide layer of an InGaAsP material is joined to the first waveguide layer by the butt jointing method.

Growth temperature ranges for an InGaAlAs material and InGaAsP material will be explained. The crystal growth temperature of the InGaAlAs material is in the range of 650° C. to 750° C. If the crystal growth temperature is below 650° C., the efficiency of the decomposition of an Al material, such as trimethylaluminum, drops and the amount of oxygen and impurities contained in a crystal layer increases. Consequently, a large number of nonradiative centers is formed and crystal morphology deteriorates. If the crystal growth temperature is above 750° C., the crystal morphology of the InP substrate deteriorates. Therefore, the crystal growth temperature is between 650° C. and 750° C. The intensity of the mass transport of InP is high in a temperature range not lower than 650° C. Therefore, a condition where the InP is exposed must be avoided in this temperature range.

The crystal growth temperature of an InGaAsP material is between 500° C. and a temperature below 650° C. The efficiency of the decomposition of source materials, such as phosphine and tertiary butylphosphine, is low, crystal growth rate is low and crystal morphology is unsatisfactory at temperatures not higher than 500° C. The substitution of elements of the group V occurs when layers differing from each other in the composition of elements of the group V, such as an InGaAsP layer and an InP layer, are superposed at temperatures not lower than 650° C. and the elements of the group V cannot be changed in the interface. Therefore, a temperature between 500° C. and a temperature below 650° C. is used for grain growth. Desirably, the crystal growth temperature is not lower than 550° C. because the efficiency of the decomposition of phosphine is sufficiently high at temperatures not lower than 550° C.

When such a structure having two optical waveguide layers and an InP layer sandwiched between the optical waveguide layers is built, reflection and scattering of light occurs at the joint of the optical waveguide layers, optical coupling efficiency drops, and the performance of the integrated optoelectronic device represented by the slope efficiency of the laser deteriorates.

The second known integrated optoelectronic device, which is formed by removing a defective layer having many defects and formed between the first and the second optical waveguide element, and connecting the first and the second optical waveguide element by a third bulk waveguide, cannot avoid the adverse influence of those problems because of the following reasons. It is difficult to remove the InP layer formed in the joint of the first and the second optical waveguide element completely by etching and the InP layer having an irregular surface remains in a space formed by removing the InP layer. Therefore, the bulk waveguide formed in the space formed by removing the InP layer is formed in an irregular shape, reflects and scatters light. Consequently, optical coupling efficiency drops and the performance of the integrated optoelectronic device represented by the slope efficiency of the laser deteriorates.

This known technique cannot fabricate a high-quality integrated optoelectronic device not causing significant scattering and reflection of light and including at least two waveguide-type optical elements of an InGaAlAs material, and a second waveguide to be formed by growing crystal of an InGaAlAs material.

Accordingly, it is a first object of the present invention to provide a method of fabricating an integrated optoelectronic device formed by butt-jointing waveguide-type optoelectronic elements containing an InGaAlAs material as a principal component on an InP substrate, capable of directly connecting the adjacent waveguide-type optoelectronic elements without forming any InP layer in the joint of the adjacent waveguide-type optoelectronic elements.

A second object of the present invention is to provide a high-performance integrated optoelectronic device scarcely causing loss and reflection of light in waveguides.

A method of fabricating an integrated optoelectronic device provided with a plurality of waveguide-type optoelectronic elements formed on an InP substrate and connected in an end-to-end fashion by butt jointing in a first aspect of the present invention includes repeating a cycle including the steps of: forming a first optical waveguide element on an InP substrate; forming a mask pattern on the first optical waveguide element formed on the InP substrate; removing part of the first optical waveguide element not covered with the mask pattern by etching to expose apart of the InP substrate; and growing crystal layers for forming a second optical waveguide element on the exposed part of the InP substrate; wherein an InGaAlAs material is a principal material among materials forming the second optical waveguide element, and an InGaAsP layer is formed on the InP substrate at a stage where the InP substrate is not yet heated at a crystal growth temperature for growing InGaAlAs crystal layers and is at a low temperature.

In the method of fabricating an integrated optoelectronic device in the first aspect of the present invention, the crystal growth temperature for forming the second optical waveguide element may be between 650° C. and 750° C., and the crystal growth temperature for forming the InGaAsP layer may be not lower than 500° C. and below 650° C.

An integrated optoelectronic device fabricating method provided with a plurality of waveguide-type optoelectronic elements formed on an InP substrate and connected in an end-to-end fashion by butt jointing in a second aspect of the present invention includes repeating a cycle including the steps of: forming a mask pattern on a first optical waveguide element formed on an InP substrate; removing part of the first optical waveguide element not covered with the mask pattern by etching to expose apart of the InP substrate; and growing crystal layers for forming a second optical waveguide element on the exposed part of the InP substrate; wherein an InGaAsP layer is formed between the first optical waveguide element and the InP substrate, the first optical waveguide element is etched such that at least some part of the InGaAsP layer remains on the InP substrate, an InGaAlAs material is a principal material among materials forming the second optical waveguide element, and the second optical waveguide element containing the InGaAlAs material as a principal material is formed on the InGaAsP layer.

In the method of fabricating an integrated optoelectronic device in the second aspect of the present invention, the second optical waveguide element may have quantum well structure, a joint of the first and the second optical waveguide element, and parts of the first and the second optical waveguide element in the vicinity of the joint may be removed by selective etching using a mask pattern after the second optical waveguide element of the quantum well structure has been formed, and a third optical waveguide element may be formed in a space formed by removing part of the first and the second optical waveguide element.

An integrated optoelectronic device in a third aspect of the present invention includes: an InP substrate; and at least two waveguide-type optoelectronic elements formed on the InP substrate and connected in an end-to-end fashion by butt jointing; wherein at least one of the waveguide-type optoelectronic elements is a layer containing an InGaAlAs material as a principal component, and an InGaAsP layer is formed between the layer of the InGaAlAs material and the InP substrate.

An integrated optoelectronic device in a fourth aspect of the present invention includes: an InP substrate; at least two waveguide-type optoelectronic elements formed on the InP substrate and connected in an end-to-end fashion by butt jointing; and at least one optical waveguide including a layer of an InGaAlAs material; wherein an InGaAsP layer is formed between the layer of the InGaAlAs material and the InP substrate, and a layer of the same construction as part of the InGaAsP layer is formed between at least one of the optical waveguides other than the optical waveguide including the layer of the InGaAlAs material and the InP substrate.

In this integrated optoelectronic device in the fourth aspect of the present invention, at least the two waveguide-type optoelectronic elements may have cores connected by bulk crystals.

It is one of advantageous effect of the present invention that the InGaAsP layer containing As is formed on a part of the surface of the InP substrate exposed by removing a part of the first optical waveguide element before heating the InP substrate at crystal growth temperature for growing InGaAlAs crystal layers in the step of growing InGaAlAs layers to form the second optical waveguide element to prevent the deposition of an InP layer in the joint of the first and the second optical waveguide element due to the mass transport of InP. Thus mass transport likely to occur when P is only the element of the group V is suppressed and any InP layer will not be formed between the first and the second optical waveguide element to obstruct the connection of the first and the second optical waveguide element.

The inventors of the present invention devised first and second methods of forming an InP layer on a part of the surface of the InP substrate exposed by partly removing the first optical waveguide element before heating the InP substrate at the growth temperature for forming the second optical waveguide element.

Figure 2A:
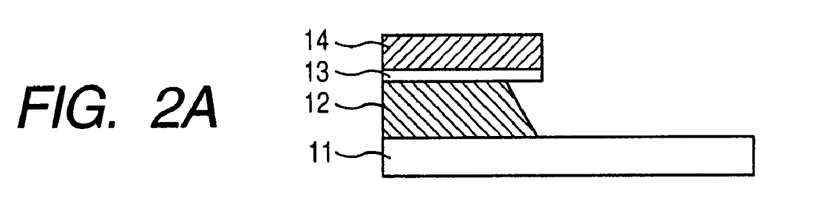
FIG. 2A is a typical sectional view of assistance in explaining the effect of the present invention.
Figure 2B:
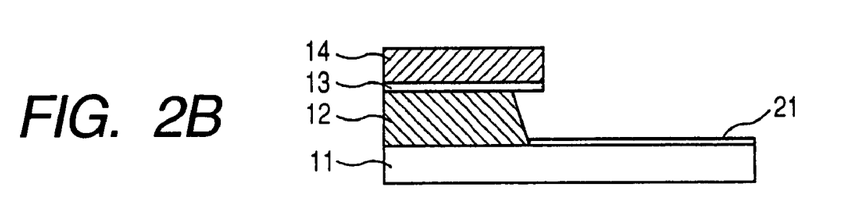
FIG. 2B is a typical sectional view of assistance in explaining the effect of the present invention.
Figure 2C:
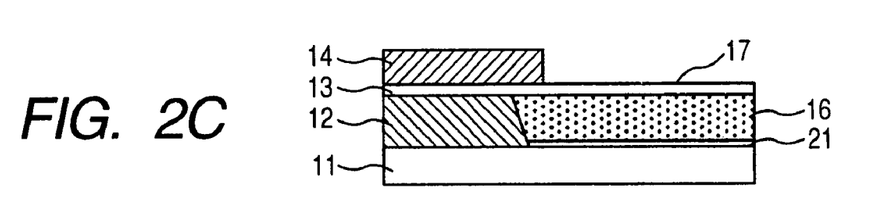
FIG. 2C is a typical sectional view of assistance in explaining the effect of the present invention.

The first method heats the InP substrate at a low temperature on the order of 600° C. to grow crystal layers of InGaAsP on the surface of the InP substrate at an initial stage of the step of forming the second optical waveguide element containing InGaAlAs material as a principal component. The first method will be described with reference to FIGS. 2A, 2B and 2C showing the steps of connecting a second optical waveguide element to a first optical waveguide element. Referring to FIG. 2A, an unnecessary part of a first optical waveguide element 12 of an InGaAlAs material is removed by selective etching using a dielectric mask 14. Then, as shown in FIG. 2B, an InGaAsP layer 21 is formed on an InP substrate 11 at a low temperature at which the mass transport of InP occurs scarcely before forming a second optical waveguide element 16. The InGaAsP layer 21 is capable of suppressing the mass transport of InP. Then, the InP substrate 11 is heated at a high temperature on the order of 700° C. for growing InGaAlAs layers to form the second optical waveguide element 16. Since the surface of the InP substrate is coated with a film containing As when the InP substrate is heated at the high temperature on the order of 700° C., the migration of InP from the InP substrate and formation of InP layer between the first optical waveguide element 12 and the second optical waveguide element 16 can be prevented. The InGaAsP layer is used as a layer containing As for suppressing the mass transport of InP because the InGaAsP layer can be formed at the low temperature on the order of 600° C. lower than the typical growth temperature on the order of 700° C. for growing layers of an InGaAlAs material, and capable of effectively suppressing the mass transport of InP.

The second method forms an InGaAsP layer beforehand on a surface of an InP substrate before growing crystal layers for a first optical waveguide element on the InP substrate, and removes an unnecessary part of the first optical waveguide element by etching such that the InGaAsP layer is etched partly so that the surface of the InP substrate may not be exposed. Thus any part of the surface of the InP substrate is not exposed and the surface of the InP substrate is coated with the layer containing As, the mass transport of InP is prevented and the first and the second optical waveguide element can be satisfactorily joined together.

Figure 3A:
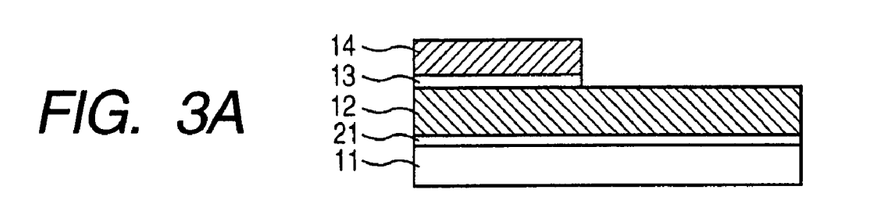
FIG. 3A is a typical sectional view of assistance in explaining the effect of the present invention.
Figure 3B:
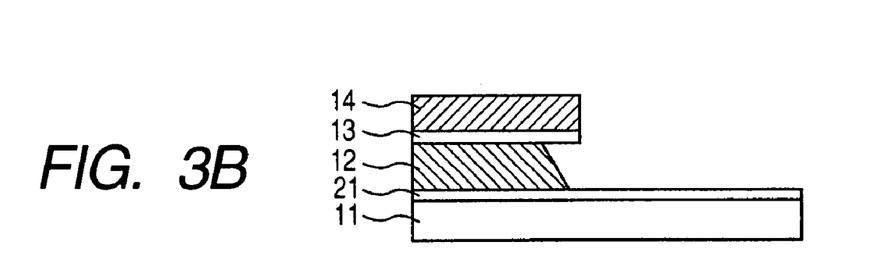
FIG. 3B is a typical sectional view of assistance in explaining the effect of the present invention.
Figure 3C:
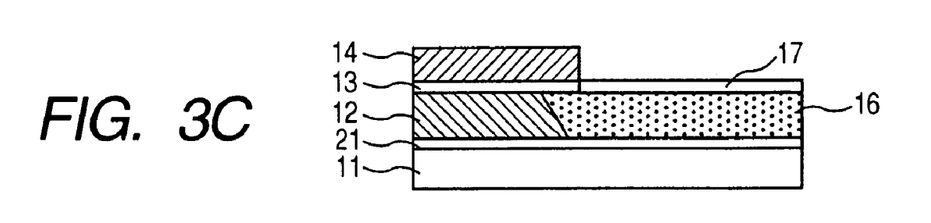
FIG. 3C is a typical sectional view of assistance in explaining the effect of the present invention.

The second method will be described with reference to FIGS. 3A, 3B and 3C. Referring to FIG. 3A, an InGaAsP layer 21 is formed on a surface of an InP substrate 11 before forming a first optical waveguide element 12. The first optical waveguide element 12 is formed on the InGaAsP layer 21. Then, as shown in FIG. 3B, an unnecessary part of the first optical waveguide element 12 is removed by dry etching or wet chemical etching using a dielectric mask 14 such that the InGaAsP layer 21 remains entirely or partly on the InP substrate. Then, the InP substrate is heated at a desired crystal growth temperature in a growth chamber to form a second optical waveguide element 16 as shown in FIG. 3C.

The InGaAsP layer 21 containing As covers the surface of the InP substrate while the InP substrate is heated at a high temperature. Therefore, the mass transport of InP can be suppressed and the first optical waveguide element 12 and the second optical waveguide element 16 can be satisfactorily joined together. The InGaAsP layer is used as a layer containing As because the InGaAsP material, as compared with the InGaAlAs material, is resistant to oxidation. If the InGaAlAs material containing Al and subject to oxidation is used, the surface of the InGaAlAs layer exposed and oxidized during etching needs to be cleaned before forming the second optical waveguide element, which enhances the complexity of the integrated optoelectronic device fabricating process.

The method of the present invention can achieve integrating InGaAlAs optical waveguide elements to form an integrated optoelectronic device having a high optical coupling efficiency and can provide a high-performance InGaAlAs integrated optoelectronic device.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

First Embodiment

Figure 4:
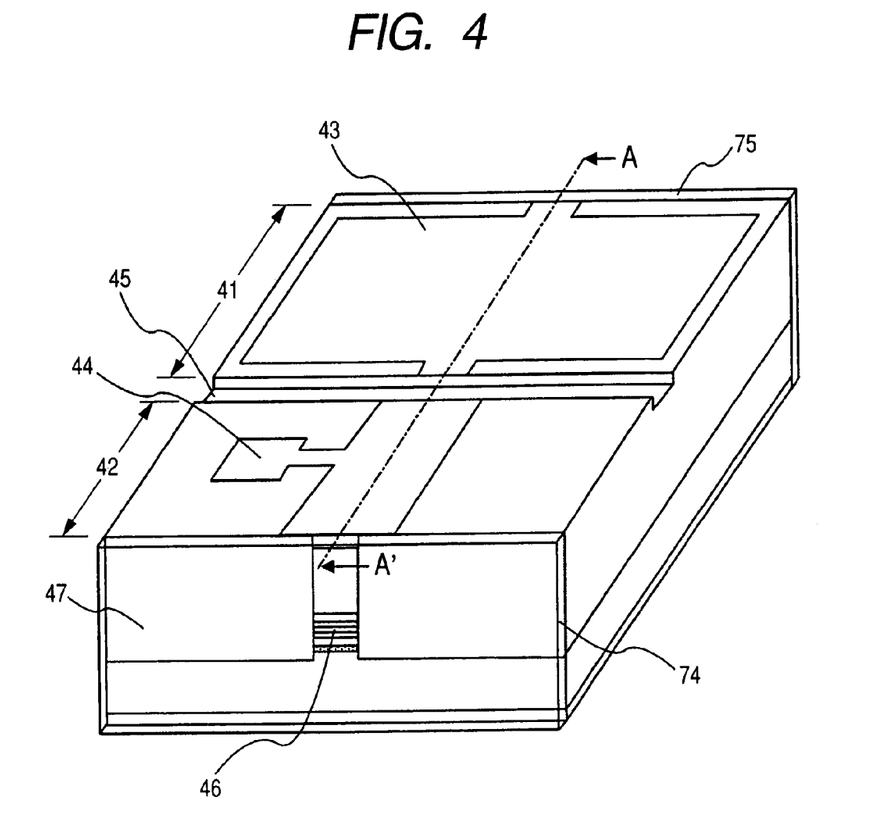
FIG. 4 is a perspective view of an integrated optoelectronic device in a first embodiment according to the present invention.

A first embodiment of the present invention will be described with reference to FIGS. 4, 5, 6A to 6G and 7. The integrated optoelectronic device in the first embodiment is an electroabsorption modulator integrated laser (EA/DFB laser) formed by integrally combining an electroabsorption modulator (EA modulator) and a distributed feedback semiconductor laser (DFB semiconductor laser). FIG. 4 is a perspective view of an EA/DFB laser in a first embodiment according to the present invention, FIG. 5 is a sectional view of the EA/DFB laser in a plane parallel to a traveling direction in which light travels through optical waveguide elements, FIGS. 6A to 6G are sectional views of assistance in explaining the steps of a method of fabricating the EA/DFB laser in the first embodiment, and FIG. 7 is a sectional view of the EA/DFB laser in the first embodiment in a plane intersecting the traveling direction of light.

Referring to FIG. 4, the EA/DFB laser has a laser 41 and an EA modulator 42. The laser 41 and the EA modulator 42 are provided with a laser electrode 43 and a modulator electrode 44, respectively. The laser 41 and the EA modulator 42 are electrically isolated from each other by a groove 45. The EA/DFB laser is provided with optical waveguide elements formed in stripes to build a generally known buried heterostructure (BH structure) 46. In this embodiment, the stripe-shaped optical waveguide elements are embedded in an InP layer 47 doped with iron and having a high resistance.

Figure 5:
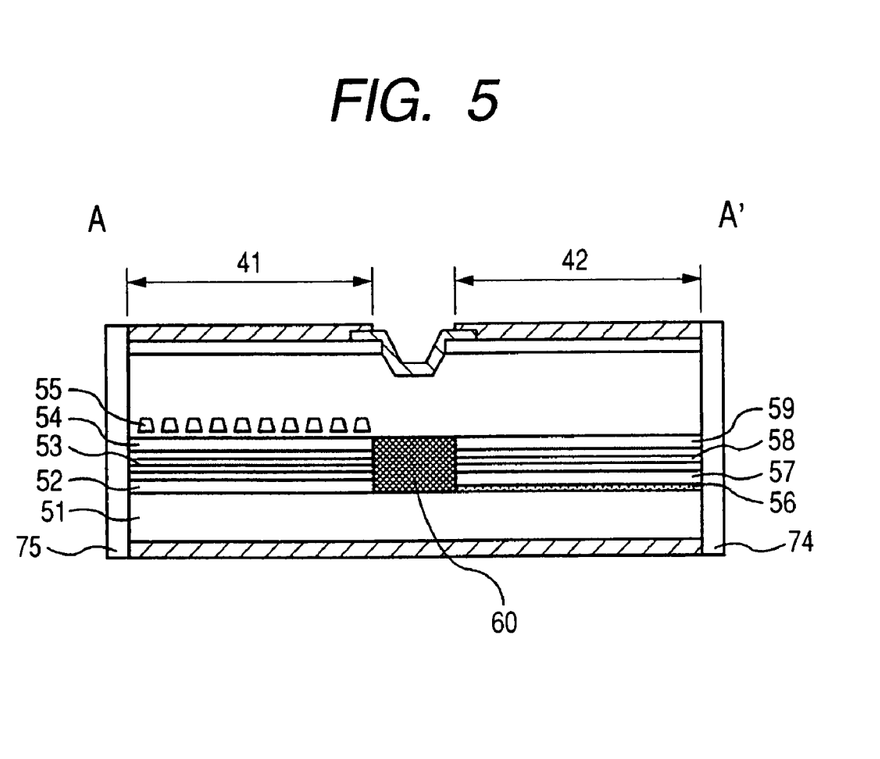
FIG. 5 is a typical sectional view of assistance in explaining the integrated optoelectronic device in the first embodiment.
Figure 6A:
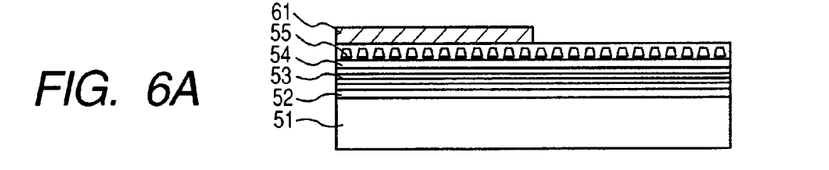
FIG. 6A is a typical sectional view of assistance in explaining the integrated optoelectronic device in the first embodiment.
Figure 6B:
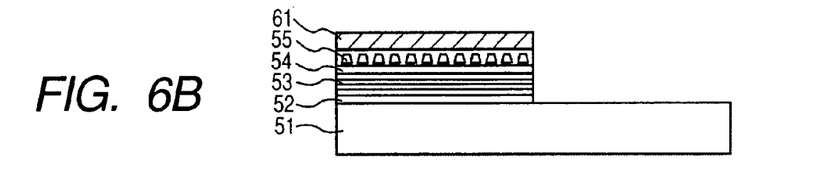
FIG. 6B is a typical sectional view of assistance in explaining the integrated optoelectronic device in the first embodiment.

FIG. 5 shows the EA/DFB laser of layered construction in a sectional view. The laser 41 and the EA modulator 42 are formed individually in different optimum layered structures, respectively, on an n-type InP substrate 51 to optimize the characteristic of the EA/DFB laser. The laser 41 includes an n-type InGaAlAs optical confinement layer 52, an InGaAlAs strained multiple quantum well layer 53, and a p-type InGaAlAs optical confinement layer 54. The quantum well layer serving as an active region is formed by stacking five periods of a 7 nm thick well layer, an 8 nm barrier layer to realize the characteristic of a laser satisfactorily. A diffraction grating layer 55 of InGaAsP is formed on the optical confinement layer 54. The active region and the diffraction grating layer 55 are formed such that the lasing wavelength of the EA/DFB laser is 1550 nm.

The optical confinement layer 52 underlying the quantum well layer 53 and the optical confinement layer 54 overlying the quantum well layer 53 confine light in the quantum well layer 53. An optical waveguide function is realized by sandwiching a core region between cladding layers having a refractive index smaller than that of the core region. A layered structure formed by stacking a cladding layer, a quantum well layer and a cladding layer in that order has an optical waveguide function. Actually, the quantum well layer is sandwiched between the optical confinement layers to confine light more effectively in the quantum well layer. The refractive index of the cladding layer is smaller than that of the optical confinement layer. In this embodiment, the substrate serves also as a lower cladding layer. Naturally, a cladding layer may be formed on the substrate.

The polarity of the diffraction grating layer may be either of an n-type and a p-type. When the polarity of the diffraction grating layer 55 is a p-type, the EA/DFB laser is an index-coupled type EA/DFB laser in which only the refractive index changes periodically in the direction of light propagation. When the polarity of the diffraction grating layer 55 is an n-type, the EA/DFB laser is a gain-coupled DFB laser because, as generally known, the diffraction grating layer serves periodically as a current blocking layer and, consequently, the gain of the active region changes periodically as well as the refractive index. Although the diffraction grating layer 55 is formed over the entire surface of the optical confinement layer 54 in this embodiment, a diffracting gating layer of phase-shift construction formed on a part of the optical confinement layer 54 may be used when necessary.

The EA modulator 42 has an n-type InGaAsP layer 56, an n-type InGaAlAs optical confinement layer 57, an undoped optical absorption layer 58, and an undoped InGaAlAs optical confinement layer 59. The n-type InGaAsP layer 56 prevents the mass transport of InP during crystal growth for forming a butt joint. The thickness of the n-type InGaAsP layer 56 is 10 nm. The optical absorption layer 58 is an InGaAlAs strained multiple quantum well layer to provide the EA modulator 42 with a satisfactory characteristic. The optical absorption layer 58 is formed by stacking ten periods of an 8 nm thick quantum well layer and a 5 nm thick barrier layer. The barrier layer of the EA modulator 42 is thin as compared with the laser 41 to improve the characteristic of the EA modulator 42 by facilitating the movement of carriers in the optical absorption layer 58.

An optical waveguide layer 60 of InGaAsP bulk is formed by a butt jointing method at the joint of the laser 41 and the EA modulator 42 to remove a defective region from the joint.

A method of fabricating the EA/DEB laser embodying the present invention will be described with reference to FIGS. 6A to 6G. The n-type InGaAlAs optical confinement layer 52, the InGaAlAs strained multiple quantum well layer 53, and the p-type InGaAlAs optical confinement layer 54 are formed in that order on the n-type InP substrate 51 to build the laser 41. Then, a multilayer structure including the InGaAsP diffraction grating layer 55 is formed on the InGaAlAs optical confinement layer 54 as shown in FIG. 6A. The multilayer structure formed on the InP substrate 51 is coated with a silicon dioxide film 61 which serves as a protective mask. Parts not coated with the silicon dioxide film 61 of the diffraction grating layer 55 and the active region are removed by an etching process. The etching process is continued until the surface of the n-type InP substrate 51 is exposed as shown in FIG. 6B. The etching process is a dry etching process, such as a reactive ion etching process (RIE process), a wet etching process, such as a selective etching process using hydrogen peroxide as an oxidizing agent, and an aqueous solution of phosphoric acid or sulfuric acid, or a combination of dry and wet etching processes.

Figure 6C:
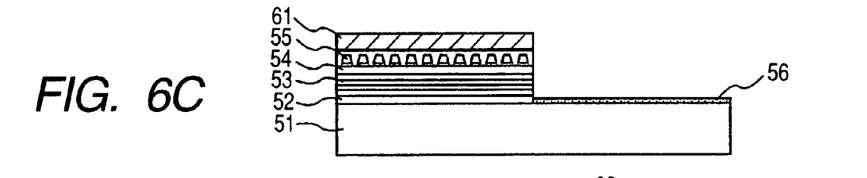
FIG. 6C is a typical sectional view of assistance in explaining the integrated optoelectronic device in the first embodiment.
Figure 6D:
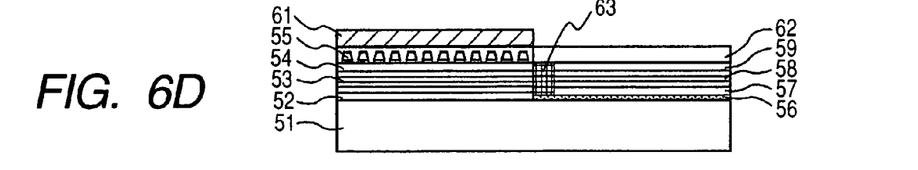
FIG. 6D is a typical sectional view of assistance in explaining the integrated optoelectronic device in the first embodiment.
Figure 7:
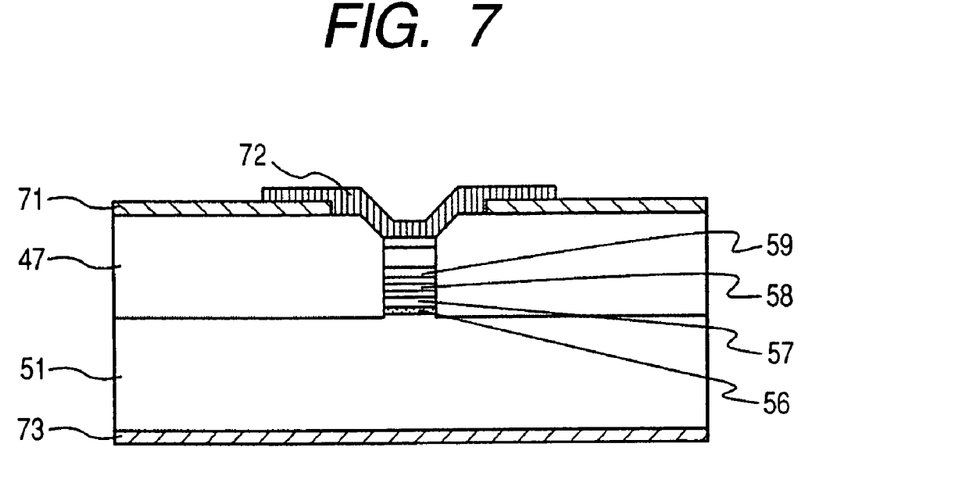
FIG. 7 is a typical sectional view of assistance in explaining the integrated optoelectronic device in the first embodiment.

Then, the InP substrate 51 provided with those layers is heated at 600° C. in a growth chamber to form the InGaAsP layer 56 on the exposed surface of the InP substrate 51 by a MOVPE method as shown in FIG. 6C. Then, the InP substrate 51 is heated at 700° C. to form the absorption region of the EA modulator 42 including the n-type InGaAlAs optical confinement layer 57, the undoped optical absorption layer 58, the undoped InGaAlAs optical confinement layer 59, and the p-type cladding layer 62. Since the surface of the InP substrate 51 is coated with the InGaAsP layer 56 containing As while the InP substrate 51 is heated at 700° C., InP will not be deposited in the joint of the laser 41 and the EA modulator 42 by mass transport and the InGaAlAs waveguide element of the laser 41 and the InGaAlAs waveguide element of the EA modulator 42 can be satisfactorily directly connected together.

Figure 6E:
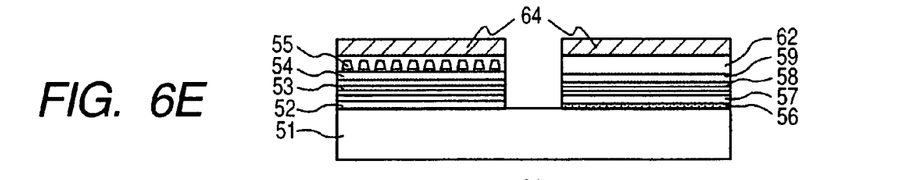
FIG. 6E is a typical sectional view of assistance in explaining the integrated optoelectronic device in the first embodiment.
Figure 6F:
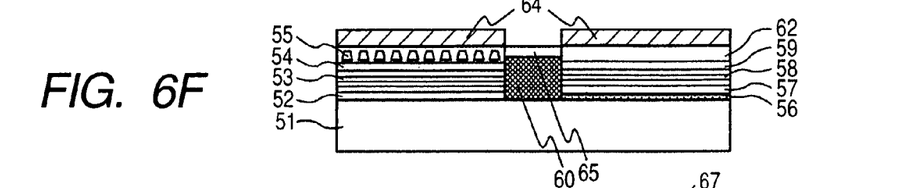
FIG. 6F is a typical sectional view of assistance in explaining the integrated optoelectronic device in the first embodiment.
Figure 6G:
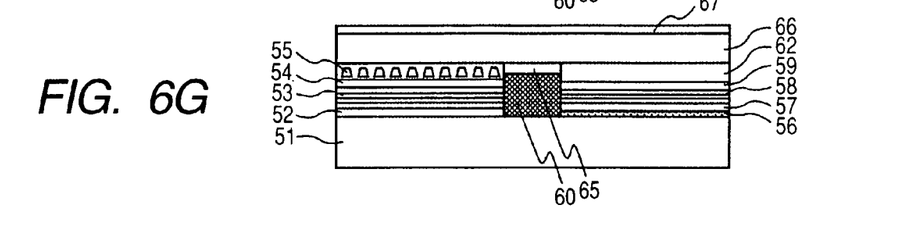
FIG. 6G is a typical sectional view of assistance in explaining the integrated optoelectronic device in the first embodiment.

When the multiple quantum well layer of the EA modulator 42 is formed by the first butt jointing step, a defective region 63 of unsatisfactory crystallinity is formed due to a selective growth effect in the vicinity of the protective mask of the laser 41. The crystallinity of the defective region 63 is unsatisfactory and the absorption edge of the multiple quantum well is shifted toward the side of longer wavelength. Therefore, the defective region 63 remaining in the EA/DFB laser causes absorption loss. A silicon nitride mask 64 having an opening corresponding to the defective region 63 and parts contiguous with the defective region 63 is formed on the laser 41 and the EA modulator 42 and the defective region 63 of about 50 μm in length is removed by an etching process as shown in FIG. 6E. This etching process, similarly to the first butt jointing step, is stopped upon the exposure of a part of the surface of the InP substrate 51 corresponding to the defective region 63. Since InP is not caused to migrate to the surface of the InP substrate 51 by mass transport in the first butt jointing step, the surface of a part of the InP substrate 51 exposed after removing the defective region 63 is flat as shown in FIG. 6E. Then, the undoped InGaAsP bulk optical waveguide layer 60 and the undoped InP layer 65 are formed as shown in FIG. 6F. Since the surface of the InP substrate 51 remains flat owing to the effect of the present invention, the shape of the undoped InGaAsP bulk optical waveguide layer 60 is not spoiled. Consequently, the InGaAlAs optical waveguide of the laser 41, the InGaAlAs optical waveguide of the EA modulator 42, and the InGaAsP bulk optical waveguide layer formed between the InGaAlAs optical waveguide of the laser 41 and the InGaAlAs optical waveguide of the EA modulator 42 are connected linearly. Thus the optical waveguide layers can be satisfactorily connected together by the InGaAsP bulk optical waveguide layer that does not scatter light and does not reflect light.

After the optical waveguide structure has been thus built by the foregoing steps, a p-type InP cladding layer 66 and a p-type InGaAs contact layer 67 are formed by a crystal growth step included in a MOVPE method. The p-type InGaAs contact layer 67 is formed to ensure satisfactory ohmic contact.

Subsequently, a mesa stripe forming steps using an ordinary dry etching process and an embedding process using a MOVPE method are executed to build an embedded heterostructure. The embedded heterostructure is formed by embedding the optical waveguide elements in a light confining material capable of confining light. The light confining material has a high resistance. In this embodiment, the stripe-shaped optical waveguide elements are embedded in the InP layer 47 doped with iron and having a high resistance. The construction of the embedded heterostructure will be well understood from FIG. 7 showing the EA/DFB laser in a sectional view taken in a plane intersecting the traveling direction of light.

Then, a silicon dioxide film 71 is formed on the InP layer 47 for passivation. Subsequently, a positive electrode 72 and a negative electrode 73 are formed. An antireflection film 74 and a high-reflection film 75 are formed on the front facet and the rear facet, respectively, of the EA/DFB laser.

The EA/DFB laser scarcely suffers from loss of light resulting from the defective connection of the optical waveguide elements and can operate at a mean slope efficiency of 0.4 W/A during continuous wave operation at a room temperature and has a highly efficient lasing characteristic. A laser in a comparative example similar to the EA/DFB laser of the present invention was fabricated and was compared with the EA/DFB laser of the present invention. The laser in the comparative example was not provided with any layer corresponding to the InGaAsP layer underlying the optical waveguide elements of the EA/DFB laser and capable of suppressing the mass transport of InP. The mean slope efficiency of the laser in the comparative example was 0.3 W/A.

The comparative examination of the EA/DFB laser of the present invention and the laser in the comparative example proved that the effect of the present invention can multiply the slope efficiency of the laser by 1.3 times. The EA/DFB laser of the present invention does not have any morphological irregularities that scatter and reflect light in the optical waveguide elements and does not have any region having crystalline defects between the optical waveguide elements. Thus the loss of light in the EA/DFB laser is far less than that in the laser having optical waveguide elements connected by a known waveguide connecting method. The EA/DFB laser of the present invention was subjected to an aging test at 50° C. under automatic power control (APC) to keep a fixed optical output of 5 mW. An estimated mean time to failure (MTTF) of the EA/DFB laser was $10^6$ hours, which proved the high reliability of the EA/DFB laser of the present invention.

Second Embodiment

Figure 8:
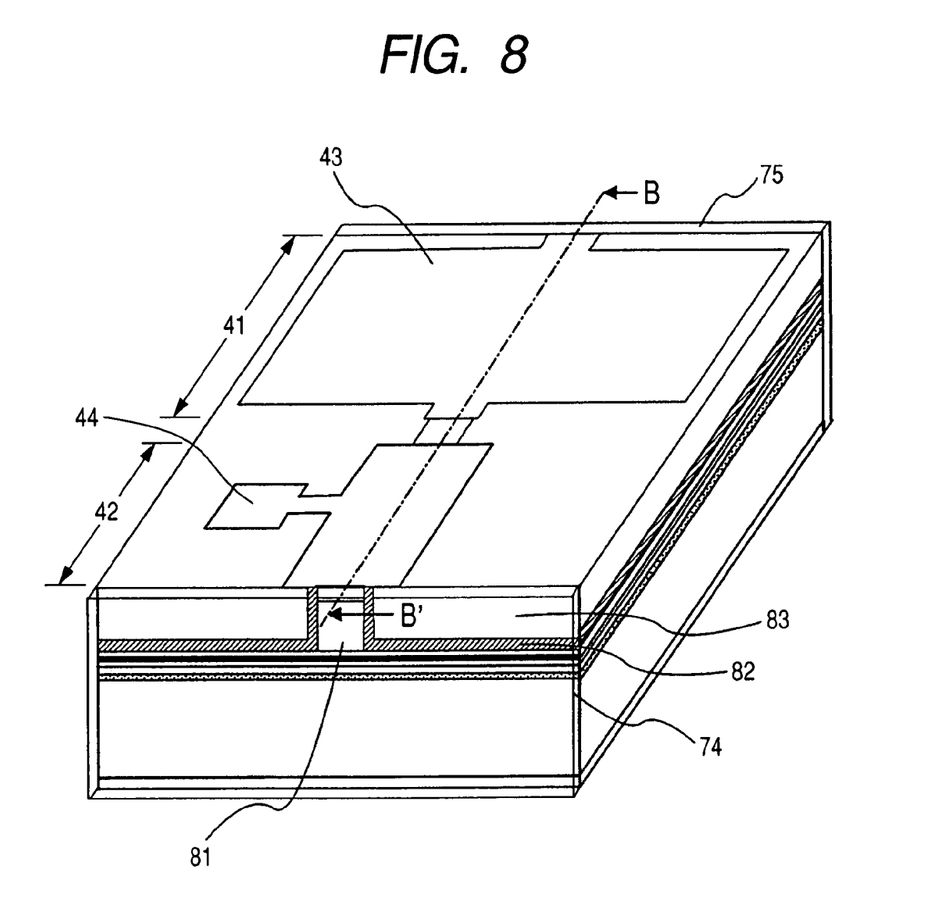
FIG. 8 is a perspective view of assistance in explaining an integrated optoelectronic device in a second embodiment according to the present invention.

A second embodiment of the present invention will be described with reference to FIGS. 8, 9, 10A to 10D and 11. An integrated optoelectronic device in the second embodiment is an electroabsorption modulator integrated laser (EA/DFB laser) formed by integrally combining an electroabsorption modulator (EA modulator) and a distributed feedback semiconductor laser (DFB semiconductor laser). The EA/DFB laser emits laser light in a 1.55 μm wavelength band. The second embodiment, as compared with the first embodiment, has the following three features. First, the EA/DBF laser in the second embodiment is fabricated by a method that forms an InGaAsP layer for preventing the mass transport of InP beforehand on a substrate prior to forming a first optical waveguide layer. Secondly, whereas the stripe-shaped optical waveguide elements for lateral mode control are embedded in the buried heterostructure in the first embodiment, optical waveguide elements are included in a ridge waveguide structure in the second embodiment. Thirdly, whereas the bulk waveguide is formed in a space formed by removing the defective region in the joint of the EA modulator and the semiconductor laser in the first embodiment, any bulk waveguide is not formed, an EA modulator and a semiconductor laser are connected directly, a defective region is left unremoved in the second embodiment. FIG. 8 is a perspective view of an EA/DFB laser in a second embodiment according to the present invention, FIG. 9 is a sectional view of the EA/DFB laser in a plane parallel to a traveling direction in which light travels through optical waveguide elements, FIGS. 10A to 10D are sectional views of assistance in explaining the steps of a method of fabricating the EA/DFB laser in the second embodiment, and FIG. 11 is a sectional view of the EA/DFB laser in the second embodiment in a plane intersecting the traveling direction of light.

Referring to FIG. 8, the EA/DFB laser includes a laser 41 and a modulator 42. The laser 41 and the EA modulator 42 are provided with a laser electrode 43 and a modulator electrode 44, respectively. The laser 41 and the EA modulator 42 are electrically isolated from each other. The EA/DFB laser has a generally known ridge waveguide structure (RWG structure) 81. Stripe-shaped ridge waveguide elements of the RWG structure 81 are coated with a silicon dioxide film 82 and are embedded in a polyimide resin layer 83.

Figure 9:
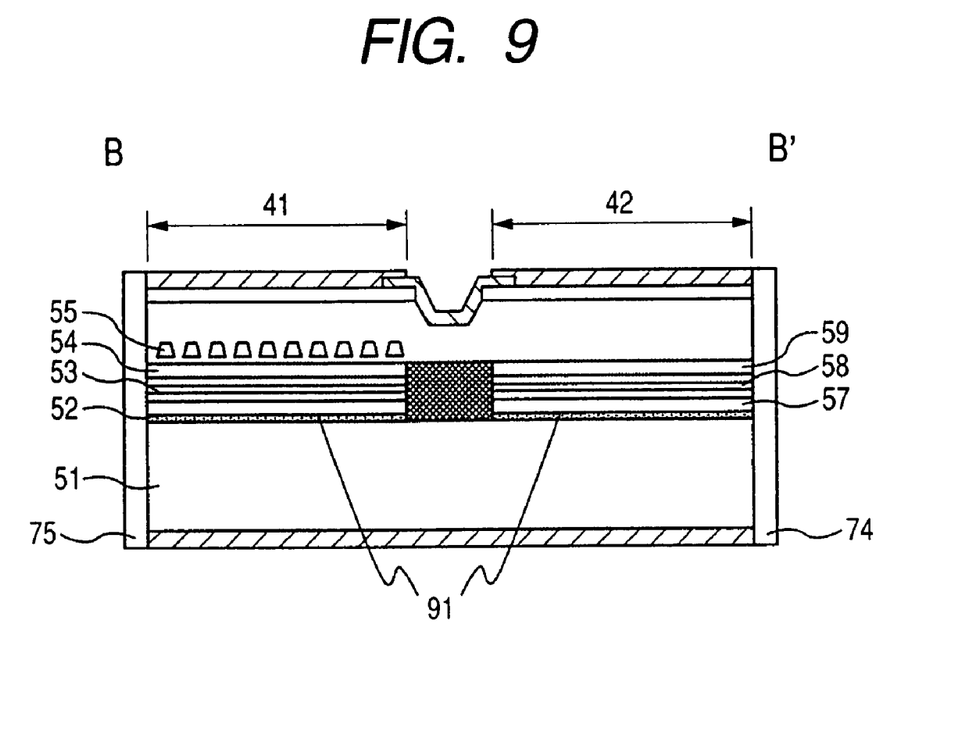
FIG. 9 is a typical sectional view of assistance in explaining the integrated optoelectronic device in the second embodiment.
Figure 10A:
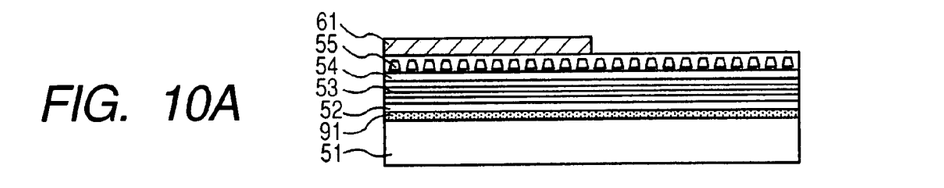
FIG. 10A is a typical sectional view of assistance in explaining the integrated optoelectronic device in the second embodiment.
Figure 10B:
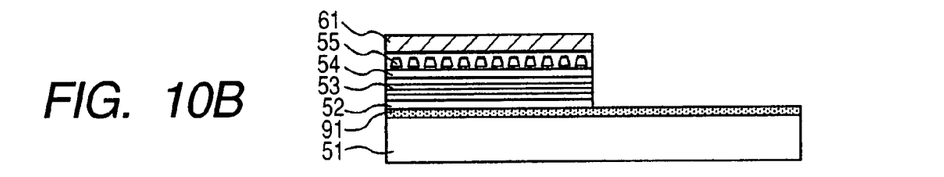
FIG. 10B is a typical sectional view of assistance in explaining the integrated optoelectronic device in the second embodiment.

FIG. 9 shows the EA/DFB laser of layered construction in a sectional view. The laser 41 and the EA modulator 42 are formed individually in optimum layered structures, respectively, on an n-type InP substrate 51 to optimize the characteristic of the EA/DFB laser. The laser 41 includes a 50 nm thick n-type InGaAsP optical confinement layer 91 for suppressing the mass transport of InP in a butt jointing step, an n-type InGaAlAs optical confinement layer 52, an InGaAlAs strained multiple quantum well layer 53, and a p-type InGaAlAs optical confinement layer 54. The quantum well layer serving as an active region is formed by stacking four periods of a 5 nm thick well layer, and a 9 nm barrier layer to realize the characteristic of a laser satisfactorily. An active region and a diffraction grating layer are formed such that the lasing wavelength of the EA/DFB laser is 1550 nm at a room temperature.

The EA modulator 42 includes the n-type InGaAsP optical confinement layer 91 for suppressing the mass transport of InP, an n-type InGaAlAs optical confinement layer 57, an undoped optical absorption layer 58, and an undoped InGaAlAs optical confinement layer 59. The optical absorption layer 58 is an InGaAlAs strained multiple quantum well layer to provide the EA modulator 42 with a satisfactory characteristic. The optical absorption layer 58 is formed by stacking eight periods of a 7 nm thick quantum well layer and a 6 nm thick barrier layer.

A method of fabricating the EA/DEB laser in the second embodiment will be described with reference to FIGS. 10A to 10D. First, the n-type InGaAsP optical confinement layer 91 for suppressing the mass transport of InP, the n-type InGaAlAs optical confinement layer 52, the InGaAlAs strained multiple quantum well layer 53, and the p-type InGaAlAs optical confinement layer 54 are formed in that order on the n-type InP substrate 51 to build the laser 41. Then, a multilayer structure including an InGaAsP diffraction grating layer 55 is formed on the InGaAlAs optical confinement layer 54 as shown in FIG. 10A. The multilayer structure formed on the InP substrate 51 is coated with a silicon dioxide film 61 which serves as a protective mask. Parts not coated with the silicon dioxide film 61 of the diffraction grating layer 55 and the active region are removed by an etching process. The etching process is continued until the surface of the n-type InGaAsP layer 91 is exposed as shown in FIG. 10B. The etching process is, for example, a dry etching process, such as a capacitively coupled reactive ion etching process (RIE process) using parallel-plate electrodes, a wet etching process, such as a selective etching process using hydrogen peroxide as an oxidizing agent, and an aqueous solution of phosphoric acid or sulfuric acid, or a combination of dry and wet etching processes.

Figure 10C:
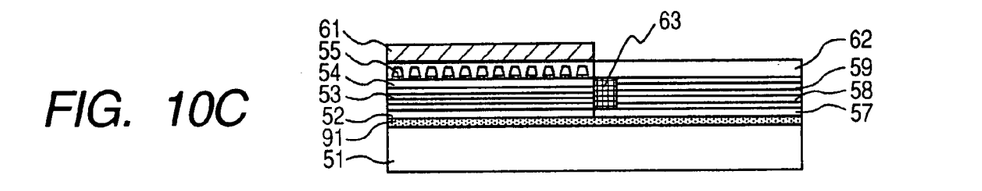
FIG. 10C is a typical sectional view of assistance in explaining the integrated optoelectronic device in the second embodiment.
Figure 11:
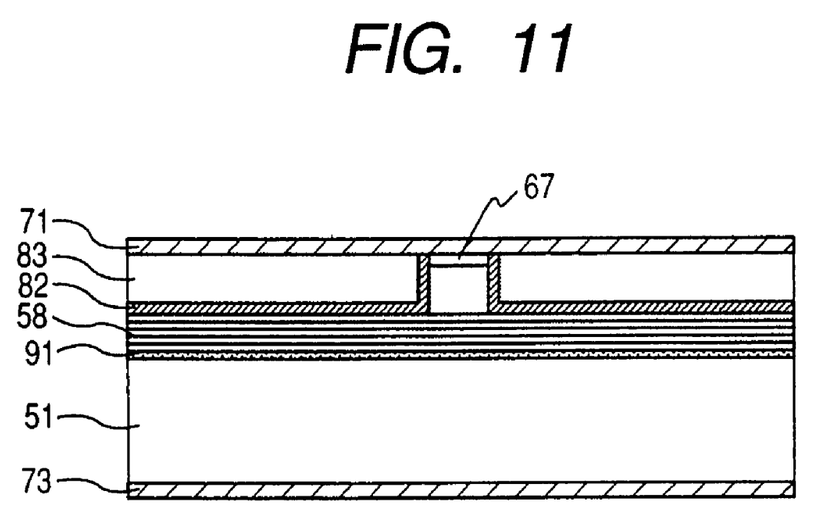
FIG. 11 is a typical sectional view of assistance in explaining the integrated optoelectronic device in the second embodiment.

Then, the InP substrate 51 provided with those layers is heated at 680° C. in a growth chamber to form the absorption region of the EA modulator 42 by a MOVPE method as shown in FIG. 10C. The absorption region of the EA modulator 42 includes the n-type InGaAlAs optical confinement layer 57, the InGaAlAs multiple quantum well optical absorption layer 58, the p-type InGaAlAs optical confinement layer 59, and a p-type InP cladding layer 62. Since the surface of the InP substrate 51 is coated with the InGaAsP layer 56 containing As while the InP substrate 51 is heated at 680° C., InP will not be deposited in the joint of an end of the laser 41 and the EA absorption region by mass transport and the InGaAlAs waveguide element of the laser 41 and the InGaAlAs waveguide element of the EA modulator 42 can be satisfactorily directly connected together.

Figure 10D:
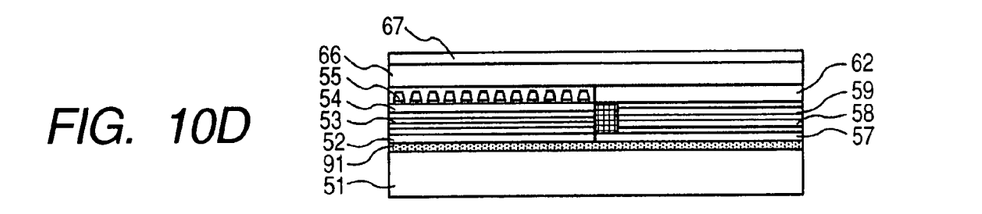
FIG. 10D is a typical sectional view of assistance in explaining the integrated optoelectronic device in the second embodiment.

After the optical waveguide structure has been thus built by the foregoing steps, a p-type InP cladding layer 66 and a p-type InGaAs contact layer 67 are formed by a crystal growth step included in a MOVPE method as shown in FIG. 10D. The p-type InGaAs contact layer 67 is formed to ensure satisfactory ohmic contact.

Subsequently, a mesa stripe forming steps using an ordinary dry etching process and an ordinary wet etching process, an isolation step of removing a part of the p-type InGaAs contact layer 67 between the laser 41 and the EA modulator 42 to isolate the laser 41 and the EA modulator electrically, a passivation step of forming a silicon dioxide film 82 on the surface of the layered structure, and an embedding step of embedding the layered structure in a polyimide resin layer 83 are carried out to form a ridge waveguide structure. The construction of the edge waveguide structure will be well understood from FIG. 11 showing the EA modulator 42 of the EA/DFB laser in the second embodiment in a sectional view in a plane intersecting the traveling direction of light.

Subsequently, a positive electrode 71 and a negative electrode 73 are formed. An antireflection film 74 and a high-reflection film 75 are formed on the front facet and the rear facet, respectively, of the EA/DFB laser.

The EA/DFB laser in the second embodiment scarcely suffers from loss of light resulting from scattering and can operate at a mean slope efficiency of 0.35 W/A during continuous wave operation at a room temperature and has a highly efficient lasing characteristic. The EA/DFB laser of the present invention was subjected to an aging test at 80° C.

under automatic power control (APC) to keep a fixed optical output of 10 mW. An estimated meantime to failure (MTTF) of the EA/DFB laser was $1.5 \times 10^6$ hours, which proved the high reliability of the EA/DFB laser of the present invention.

Although the invention has been described as applied to the EA/DFB laser that emits laser light in a 1.55 μm wavelength band, the present invention is applicable also to the EA/DFB laser that emits laser light in a 1.3 μm wavelength band. Although the invention has been described as applied to the EA/DFB laser, the present invention is applicable also to other integrated optical devices including a beam spot expander integrated laser.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. An integrated optoelectronic device fabricating method of fabricating an integrated optoelectronic device provided with a plurality of waveguide-type optoelectronic elements formed on an InP substrate and connected in an end-to-end fashion by butt jointing, said method executing at least one cycle including the steps of:
   forming a first optical waveguide element on an InP substrate
   forming a mask pattern on the first optical waveguide element formed on the InP substrate;
   removing part of the first optical waveguide element not covered with the mask pattern by etching to expose a part of a surface of the InP substrate; and
   growing crystal layers to forming a second optical waveguide element containing InGaAlAs on the exposed part of the InP substrate;
   wherein an InGaAsP layer is formed on an exposed part of the surface of the InP substrate at a crystal growth temperature lower than a crystal growth temperature for growing layers to form the second optical waveguide element.

2. The integrated optoelectronic device fabricating method according to claim 1, wherein the crystal growth temperature for forming the second optical waveguide element is between 650° C. and 750° C., and the crystal growth temperature for forming the InGaAsP layer is not lower than 500° C. and below 650° C.

3. The integrated optoelectronic device fabricating method according to claim 1 further comprising the steps of:
   forming a quantum well structure in the second optical waveguide element;
   selectively removing a joint of the first and the second optical waveguide element, and parts of the first and the second optical waveguide element in the vicinity of the joint by selective etching using a mask pattern after the quantum well structure has been formed; and
   forming a third optical waveguide element having at least a core of bulk crystals in a space formed by removing part of the first and the second optical waveguide element, and the parts of the first and the second optical waveguide element in the vicinity of the joint by selective etching.

4. An integrated optoelectronic device fabricating method of fabricating an integrated optoelectronic device, said method executing at least one cycle including the steps of:
   forming an InGaAsP layer on a surface of an InP substrate;
   forming a first optical waveguide element on the InGaAsP layer;
   forming a mask pattern on the first optical waveguide element;
   removing a part of the first optical waveguide element not covered with the mask pattern by etching to expose a part of the surface of the InP substrate; and
   growing crystal layers to form a second optical waveguide element containing InGaAlAs on the exposed part of the InP substrate.

5. The integrated optoelectronic device fabricating method according to claim 4, wherein the crystal growth temperature for forming the second optical waveguide element is between 650° C. and 750° C., and the crystal growth temperature for forming the InGaAsP layer is not lower than 500° C. and below 650° C.

6. The integrated optoelectronic device fabricating method according to claim 4 further comprising the steps of:
   forming a quantum well structure in the second optical waveguide element;
   selectively removing a joint of the first and the second optical waveguide element, and parts of the first and the second optical waveguide element in the vicinity of the joint by selective etching using a mask pattern after the quantum well structure has been formed; and
   forming a third optical waveguide element having at least a core of bulk crystals in a space formed by removing part of the first and the second optical waveguide element, and the parts of the first and the second optical waveguide element in the vicinity of the joint by selective etching.

7. An integrated optoelectronic device comprising:
   an InP substrate;
   at least one first optical waveguide element formed on the InP substrate;
   at least one second optical waveguide element containing InGaAlAs and formed on the InP substrate and connected to the first optical waveguide element in an end-to-end fashion by butt jointing;
   wherein an InGaAsP layer is formed between at least either of the first and the second optical waveguide element, and the InP substrate.

8. The integrated optoelectronic device according to claim 7, wherein at least respective cores of the first and the second optical waveguide element are connected by a layer of bulk crystals.

9. The integrated optoelectronic device according to claim 7, wherein a nondoped InGaAsP layer is formed in a region between a region in which the first optical waveguide element is formed and a region in which the second optical waveguide element is formed.

10. The integrated optoelectronic device according to claim 7, wherein a semiconductor laser including the first optical waveguide element, and a modulator including the second optical waveguide element are formed on the InP substrate.

11. An integrated optoelectronic device comprising:
   an InP substrate;
   at least one first optical waveguide element formed on the InP substrate;
   at least one second optical waveguide element containing InGaAlAs and formed on the InP substrate and connected to the first optical waveguide element in an end-to-end fashion by butt jointing;
   wherein an InGaAsP layer is provided on at least a part of the InP substrate and at least either of the first optical waveguide element and the second optical waveguide element is provided on the InGaAsP layer.

12. The integrated optoelectronic device according to claim 11, wherein at least respective cores of the first and the second optical waveguide element are connected by a layer of bulk crystals.

13. The integrated optoelectronic device according to claim 11, wherein a nondoped InGaAsP layer is formed in a region between a region in which the first optical waveguide element is formed and a region in which the second optical waveguide element is formed.

14. The integrated optoelectronic device according to claim 11, wherein a semiconductor laser including the first optical waveguide element, and a modulator including the second optical waveguide element are formed on the InP substrate.

* * * * *